(12) United States Patent
Yeh et al.

(10) Patent No.: US 6,692,979 B2
(45) Date of Patent: Feb. 17, 2004

(54) METHODS OF FABRICATING OPTOELECTRONIC IC MODULES

(75) Inventors: Jang-Hun Yeh, Irvine, CA (US); Xueya Wen, Irvine, CA (US); Jinhui Zhai, Irvine, CA (US)

(73) Assignee: Optoic Technology, Inc., Irvine, CA (US)

( * ) Notice: Subject to any disclaimer, the term of this patent is extended or adjusted under 35 U.S.C. 154(b) by 0 days.

(21) Appl. No.: 09/928,528

(22) Filed: Aug. 13, 2001

(65) Prior Publication Data

US 2003/0032209 A1 Feb. 13, 2003

(51) Int. Cl.[7] .............................................. H01L 21/00
(52) U.S. Cl. ........................................... 438/27; 438/28
(58) Field of Search ........................... 438/24, 25, 26, 438/27, 29, 33, 34, 55, 56, 69, 71, 459

(56) References Cited

U.S. PATENT DOCUMENTS

| | | | | |
|---|---|---|---|---|
| 5,093,679 A | * | 3/1992 | Taniguchi et al. | ............ 396/56 |
| 5,093,879 A | * | 3/1992 | Bregman et al. | ........... 327/306 |
| 5,222,014 A | | 6/1993 | Lin | |

(List continued on next page.)

FOREIGN PATENT DOCUMENTS

| WO | WO 00/30226 | 5/2000 |
|---|---|---|

OTHER PUBLICATIONS

U.S. application No. 09/928,893, filed Aug. 13, 2001, entitled Optoelectronic IC Module (OPTOIC.001A).

U.S. application No. 09/928,320, filed Aug. 13, 2001, entitled VCSEL Structure and Method of Making Same (OPTOIC.003A).

A. Krishnamoorthy et al., *CMOS Static RAM Chip with High–Speed Optical Read and Write*; IEEE Photonics Technology Letters, vol. 9, No. 11, Nov. 1997; pp. 1517–1519.

A. Krishnamoorthy et al., *16x16 VCESEL Array Flip–Chip Bonded to CMOS VLSI Circuit*; IEEE Photonics Technology Letters, vol. 12, No. 8, Aug. 2000; pp. 1073–1075.

E. Brass et al.; *System Integration of Optical Devices and Analog CMOS Amplifiers*; IEEE Journal of Solid–State Circuits, vol. 29, No. 9, Aug. 1994; pp. 1006–1010.

A. Krishnamoorthy et al., *Vertical–Cavity Surface–Emitting Lasers Laser–Chip Bonded to Gigabit–per–Second CMOS Circuits*; IEEE Photonics Technology Letters, vol. No. 1, Jan. 1999; pp. 128–130.

*Primary Examiner*—Carl Whitehead, Jr.
*Assistant Examiner*—W Vesperman
(74) *Attorney, Agent, or Firm*—Knobbe, Martens, Olson & Bear, LLP

(57) ABSTRACT

A optoelectronic module comprises one or more VCSELs electrically connected to an IC and optically connected to a fiber optic faceplate. The fiber optic faceplate, comprising a closely packed bundle of optical fibers, permits efficient capture of light from the VCSELs. Precise alignment of the faceplate with respect to the VCSELs is not needed since light not collected by one fiber is captured by another nearby optical fiber. One method of fabricating the module comprises forming substrate layers on both sides of the VCSELs such that features can be formed on the first substrate layer while the second temporary substrate layer provides structural support. The method further comprises forming apertures on the first substrate layer by etching. An etch stop buffer layer positioned between the first substrate layer and the VCSELs protects the VCSELs from being etched in the process. The second temporary substrate layer is removed after the fiber optic faceplate is mounted on the first substrate side. An alternate method of VCSEL fabrication comprises forming an aperture by patterning a dielectric layer above an active layer within the VCSEL. The aperture in the dielectric layer can be formed with a high degree of precisely using conventional patterning techniques. The dielectric layer is part of a current confinement element that concentrates current in an active region. A top DBR can also be formed of multiple layers of dielectric.

18 Claims, 11 Drawing Sheets

U.S. PATENT DOCUMENTS

| | | | |
|---|---|---|---|
| 5,557,693 A | | 9/1996 | Stevens et al. |
| 5,600,541 A | | 2/1997 | Bone et al. |
| 5,696,031 A | | 12/1997 | Wark |
| 5,837,561 A | * | 11/1998 | Kish et al. .................... 438/47 |
| 5,848,214 A | | 12/1998 | Haas et al. |
| 5,877,038 A | | 3/1999 | Coldren et al. |
| 5,898,223 A | | 4/1999 | Frye et al. |
| 5,899,705 A | * | 5/1999 | Akram ...................... 438/107 |
| 5,923,796 A | | 7/1999 | Feldman et al. |
| 5,936,305 A | | 8/1999 | Akram |
| 5,973,403 A | | 10/1999 | Wark |
| 6,044,100 A | | 3/2000 | Hobson et al. |
| 6,137,929 A | | 10/2000 | Rosenberg et al. |
| 6,151,173 A | * | 11/2000 | Massit et al. ................ 359/811 |
| 6,169,756 B1 | | 1/2001 | Chirovsky et al. |
| 6,238,944 B1 | | 5/2001 | Floyd |
| 6,259,846 B1 | | 7/2001 | Roach et al. |
| 6,423,560 B1 | * | 7/2002 | Trezza et al. ................. 438/25 |
| 6,450,701 B1 | | 9/2002 | Cryan et al. |
| 2002/0025125 A1 | | 2/2002 | Williams |
| 2002/0072138 A1 | * | 6/2002 | Trezza et al. ................. 438/23 |

* cited by examiner

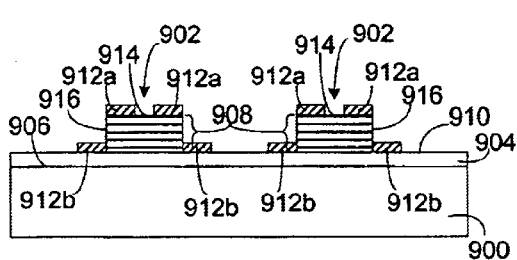
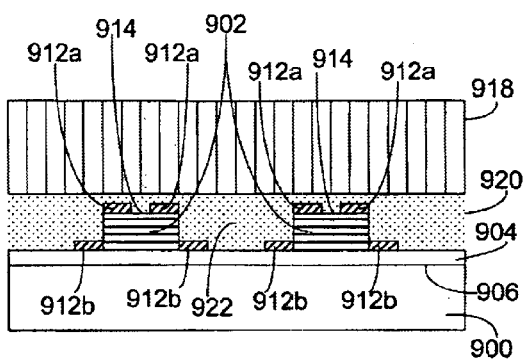
FIGURE 6A　　　　　　　　FIGURE 6B
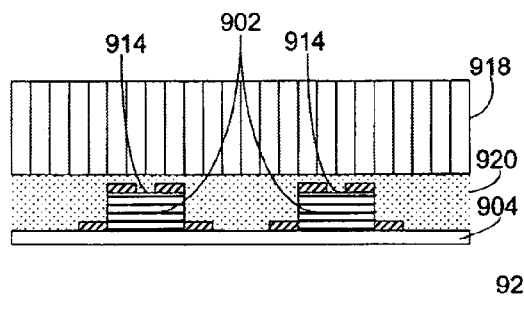
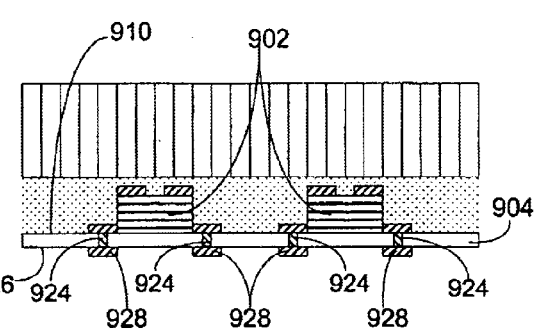
FIGURE 6C　　　　　　　　FIGURE 6D

METHODS OF FABRICATING OPTOELECTRONIC IC MODULES

RELATED APPLICATION

This application is related to co-pending U.S. patent application Ser. No. 09/928,893 filed Aug. 13, 2001 entitled "Optoelectronic IC Module" and co-pending U.S. patent application Ser. No. 09/928,320 filed Aug. 13, 2001 entitled "VCSEL Structure and Method of Making Same.",

BACKGROUND OF THE INVENTION

1. Field of the Invention

This invention relates to optoelectronic devices, more particularly, to Vertical Cavity Surface Emitting Lasers (VCSELs).

2. Description of the Related Art

Use of optically transmitted signals in communication systems is dramatically increasing the throughput rate of data transfer. In typical network configurations, an electrical signal is converted into an optical signal by either a laser diode or a light emitting diode (LED). The optical signal is transported through a waveguide such as an optical fiber to an optical detector, which converts the optical signal into an electronic one.

A unit can be assembled that incorporates components for performing many of these functionalities into a single module. Such a module may comprise an integrated circuit, one or more light sources such as LED or laser diodes, and one or more optical detectors such as silicon, InP, InGaAs, Ge, or GaAs photodiodes. The optical detector is used to detect optical signals and transform them into electrical waveforms that can be processed by integrated circuitry in the IC. In response, optical signals are output by the light sources, which may be controlled by the circuitry in the IC. The optical detector(s) may be formed on a silicon, InP, InGaAs, Ge, or GaAs substrate while the optical source(s) are included on a GaAs, InGaAs, InP, InGaAsP, AlGaAs, or AlGaAsSb substrate. The integrated circuitry can be incorporated into either or both of the two semiconductor chips. The two chips may be bonded together, using for example, flip-chip or conductive adhesive technology.

In many cases, laser diodes are preferred over LEDs as light sources. The laser diode, for example, provides a higher intensity beam than the LED. Additionally, its optical output also has a narrower wavelength spectrum, which is consequently less affected by dispersion caused by transmission through the optical fiber. "Laser diode" is a general term that includes two broad types of semiconductor lasers. The first type of laser diode is an edge-emitting laser that emits light through an edge of an active region that comprises, for example, a p-n junction layer. The second type of semiconductor laser diode is a vertical cavity surface emitting laser (VCSEL).

A typical VCSEL comprises a plurality of layers of semiconductor material stacked on top of each other. A region centrally located within the stack corresponds to the active region comprising a p-n junction formed by adjacent p- and n-doped semiconductor layers. This active region is conventionally interposed between two distributed Bragg reflectors (DBRs), each DBR comprising a plurality of semiconductor layers with thicknesses selected so as to facilitate Bragg reflection as is well-known in the art.

The term "vertical" in Vertical Cavity Surface Emitting Laser pertains to the fact that the planar layers comprising the DBRs and the active region, when oriented horizontally, are such that a normal to the planes faces the vertical direction and light from the VCSEL is emitted in that vertical direction in contrast with horizontal emission emanating from a side of an edge-emitting laser. VCSELs offer several advantages over edge-emitting lasers, for example, VCSELs are typically much smaller than edge-emitting lasers. Furthermore, VCSELs produce a high intensity output. This latter advantage, however, can be negated if the emitted beam cannot be effectively captured and transmitted to an external location, e.g., via a waveguide. Typically, an optical coupling element such as a lens must be positioned adjacent to and aligned precisely with the VCSEL in order to achieve efficient optical coupling. This process reduces the cost effectiveness of using VCSELs in many instances, especially when a plurality of VCSELs are arranged in a one- or two-dimensional array.

Another advantage afforded by the VCSEL is increased beam control, which is provided by an aperture that is formed in one or more of the semiconductor layers. This aperture is conventionally formed by exposing the stack of semiconductor layers to water vapor to oxidize one of the layers. Initially outer edges of this semiconductor layer begin oxidizing; however, this oxidation progresses inward until the water vapor can no longer permeate the layer from the sides, wherein oxidation stop. Thus, a central region of the semiconductor layer remains un-oxidized. When the VCSEL is activated, current will flow through this central region and not through the surrounding oxide barrier. In this manner, the current flow is confined to a small portion of the active layer. Recombination of electrons and holes within this region causes light to be generated only within a small, localized area within the VCSEL. For the foregoing reasons, this aperture and the layer containing it are conventionally referred to in the art as a current confinement layer.

Disadvantageously, controlling the fabrication of the current confinement layer is particularly difficult. Vapor flow rates, temperature, and exposure time are among the many variables that affect the size and quality of the aperture that can be formed. Precise control of the dimensions of the aperture, upon which the size of the beam critically depends, is particularly problematic.

Accordingly, there is a need for improved optical coupling of the output light from the VCSEL to an external light-carrying medium such as waveguides. There is also a need for a more precise process for fabricating the current-confinement region within the VCSEL that largely defines its beam profile.

SUMMARY OF THE INVENTION

One aspect of the invention is a method of forming an optoelectronic module. The method comprises forming a plurality of optoelectronic devices on a substrate; removing at least a portion of the substrate, and mounting a fiber optic faceplate at the location of the removed substrate to receive light from the optoelectronic devices. In one embodiment, the method further comprises stabilizing the optoelectronic devices prior to mounting the fiber optic faceplate. Preferably, the step of stabilizing the optoelectronic devices comprises forming a temporary substrate over the optoelectronic devices. In one embodiment, forming the temporary substrate comprises filling interstices between optoelectronic devices with a filler material and attaching a temporary substrate to the filler material. The temporary substrate is preferably removed after the fiber optic faceplate is mounted. In another embodiment, forming the optoelectronic devices on the substrate comprises providing an etch stop layer between the optoelectronic devices and the substrate to protect the optoelectronic devices from etchants. In yet another embodiment, openings are etched through the substrate for light to pass from optoelectronic devices through the openings. The optoelectronic devices may comprise VCSELs and/or optical detectors.

In another aspect, a method of forming an optoelectronic module includes forming a plurality of optoelectronic devices on a substrate and removing at least a portion of the substrate. A substantially optically transmissive element is mounted at the location of the removed substrate to provide an optical path to the optoelectronic devices. The optoelectronic devices are stabilized prior to mounting the optically transmissive element by affixing a temporary substrate to the optoelectronic devices. The optoelectronic devices may comprise VCSELs and/or optical detectors.

In yet another aspect of the invention, a method of forming an optoelectronic module includes forming a Vertical Cavity Surface Emitting Laser (VCSEL) on at least one layer that is formed on a substrate and removing the substrate. The at least one layer is mounted to an integrated circuit (IC) chip and vias are formed in the at least one layer to provide electrically conducting pathways from the VCSEL to the IC chip. A faceplate is mounted above the VCSEL to receive light from the VCSEL.

In still another aspect, a method of forming an optoelectronic device comprises forming a multiplicity of VCSELs on a wafer and cutting the wafer into a plurality of pieces such that each piece contains a plurality of VCSELs. The pieces are mounted to respective IC chips and electrically connected to the VCSELs. In one embodiment, the method further comprises performing functionality tests on the pieces prior to mounting the pieces to respective IC chips. Preferably, the pieces are mounted to the IC chips by solder bonding, thermo-compression bonding, or conductive adhesive.

BRIEF DESCRIPTION OF THE DRAWINGS

FIGS. 6A–6D are cross-sectional views schematically depicting a preferred method of fabricating the electro-optic module of FIG. 5;

DETAILED DESCRIPTION OF THE PREFERRED EMBODIMENT

Reference will now be made to the drawings wherein like numerals refer to like parts throughout. Various aspects and embodiments of electro-optic devices, vertical cavity surface emitting lasers (VCSELs), and modules formed by the VCSELs, including fabrication processes, are described herein.

Figure 1A:
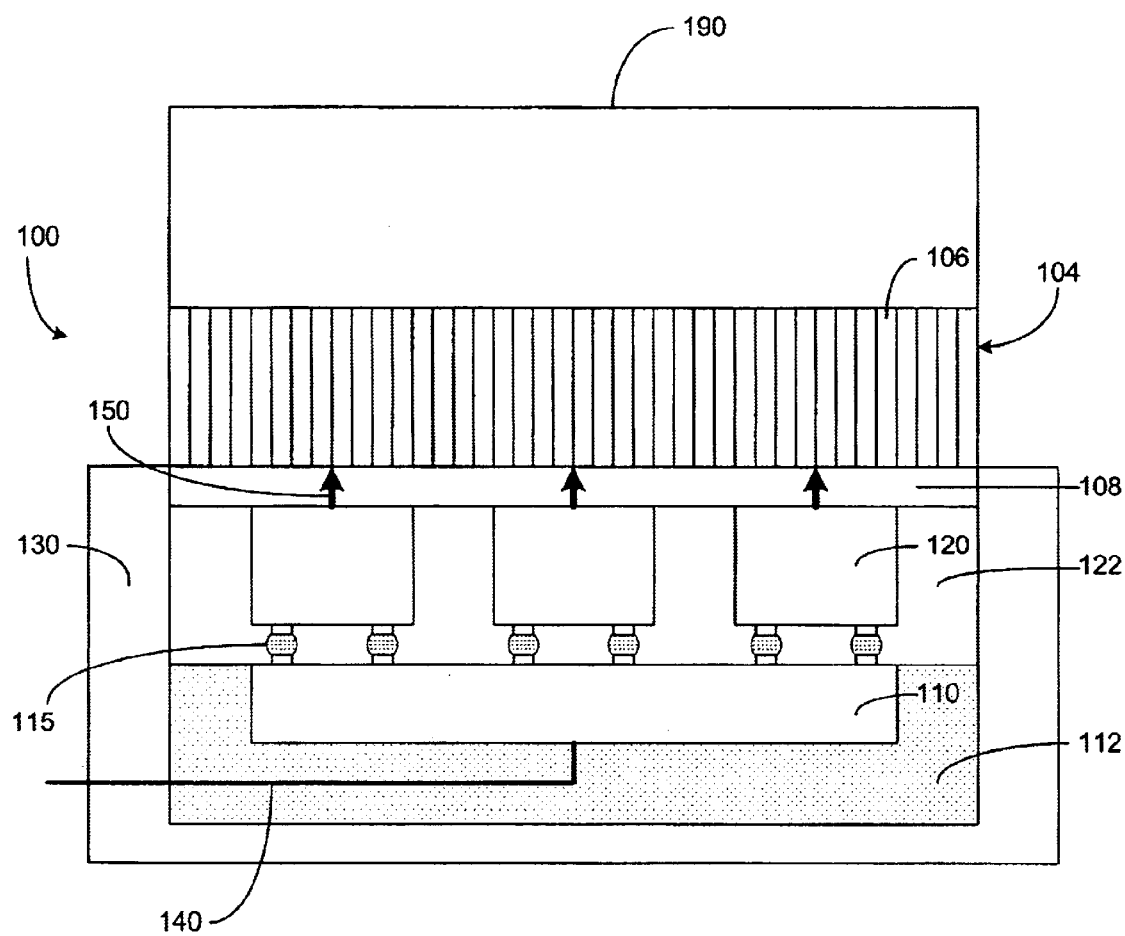
FIG. 1A is a cross-sectional view schematically illustrating an electro-optic module, comprising vertical cavity surface emitting lasers (VCSELs) optically coupled to a fiber optic faceplate, which comprises optical fibers vertically directed to receive light emitted by the VCSELs.

As shown in FIG. 1A, an optical apparatus 100 comprises a fiber optic faceplate 104 mounted to an array of electro-optic devices, and more particularly, to a first side of a plurality of VCSELs 120. An integrated circuit (IC) 110 is attached to a second side of the VCSELs 120, and electrical connections are formed between the IC 110 and the VCSELs 120 by interconnects 115. In one embodiment, the interconnects 115 comprise solder which bonds the VCSELs 120 to the IC 110. Other bonding methods such as thermo-compression and conductive adhesive can also be used. The IC 110 may provide signals and power to the VCSELs 120 such that the VCSELs output light 150 in a manner well-known in the art. The IC 110 typically includes a substrate 112 on which integrated circuitry is formed and is connected externally by an electrical connection 140 which may take the form of one or more electrical leads. A casing 130 surrounding the IC 110 provides protection and mechanical support for the IC and the VCSELs 120.

The apparatus 100 is not limited to any particular type of VCSEL 120 or IC 110. A variety of VCSELs 120, which output different or same wavelength light over a wide range of intensity levels, currently available or yet to be devised may be suitably employed. The particular technology used to fabricate such VCSEL devices is also not to be restricted. Similarly, any number of a wide range of materials and technologies can be employed to fabricate the ICs. In addition, the integrated circuits 110 used also can vary and are not limited to any particular type or design.

The optical apparatus 100 further comprises an optical interface 108 that permits the fiber faceplate 104 to be attached to the VCSELs 120. In one embodiment, the optical interface 108 is an optical adhesive or glue that is substantially optically transmissive. Index matching fluid may also be employed especially in the case where the faceplate is mechanically secured to IC 110 by means other than an optical adhesive. The faceplate 104 preferably comprises a plurality of fibers 106 sized to capture a substantial portion of the light 150 and optically couple the VCSELs 120 to an optical element 190. The optical element 190 comprises a substantially optically transmissive medium such as a waveguide. Preferably, this optical element 190 comprises one or more optical fibers for transmitting light from VCSELs 120 to a remote location.

As is well-known, fiber optic faceplates 104 may comprise plastic, glass, quartz, or other optically transmissive materials and may range in size between about 0.5 mm and 10 mm across for rectangular faceplates and between about 0.5 mm and 10 mm in diameter for circular shaped faceplates. The thickness may range between about 0.25 mm and 5 mm but preferably is in the range of between about 0.5 mm and 1 mm. However, faceplates 104 outside these dimensions may also be suitably employed.

The optical fibers 106 within the faceplate 104 may range in diameter between about 2 μm and 100 μm and more preferably between about 5 μm and 15 μm but are not restricted to these sizes. Similarly, the optical apparatus 100 is not limited to optical faceplates 104 comprising optical fibers, rather waveguides and light pipes other than optical fibers are possible. As is well-known, the waveguides comprise at least two materials, for example, optical fibers 106 comprise a core and cladding. These materials confine light therein by total internal reflection. As discussed above, these materials may include glass or polymer-based materials, as well as, quartz, fuse-silica or other materials well-known or yet to be devised. The materials selected, and more particularly, their indices of refraction, determine the numerical aperture (N.A.) of the fibers 106 or waveguides within the plate 104. Preferably, this numerical aperture range between about 0.1 and 1.0, and more preferably between about 0.2 and 0.3. Examples of fiber optic faceplates 104 suitable for use in the optical apparatus 100 are available from Schott Fiber Optics and Incom, Inc. of Massachusetts.

Use of the fiber faceplate 104 to transmit light 150 from the VCSELs 120 to the optical element 190 is advantageous due to the relative ease of capturing a substantial portion of the light 150 from the VCSEL 120 especially if the numerical aperture of the fiber 106 in the fiber optic faceplate 104 matches or exceeds the corresponding numerical aperture associated with the output beam diverging from the VCSEL 120. Because the faceplate 104 comprises a plurality of optical fibers 106 packed closely together, a substantial portion of the light 150 not captured by one fiber is captured by other surrounding fibers. Thus, use of multiple fibers 106 or other waveguides closely packed for each light output 150 relaxes the alignment requirement needed to effectively collect light from the VCSELs 120. An alternative method of coupling light out of the VSCEL 120 is to use a microlens; however, alignment is significantly more difficult. For example, in addition to aligning the lateral position of the lens, the distance of the lens from the VSCEL 120 needs to be appropriately fixed and more troublesome, the proper orientation of the lens needs to be established. Any axial misalignment of the lens will send the beam emanating from the VCSEL 120 askew thereby degrading optically coupling into subsequent optical elements 190.

Figure 1B:
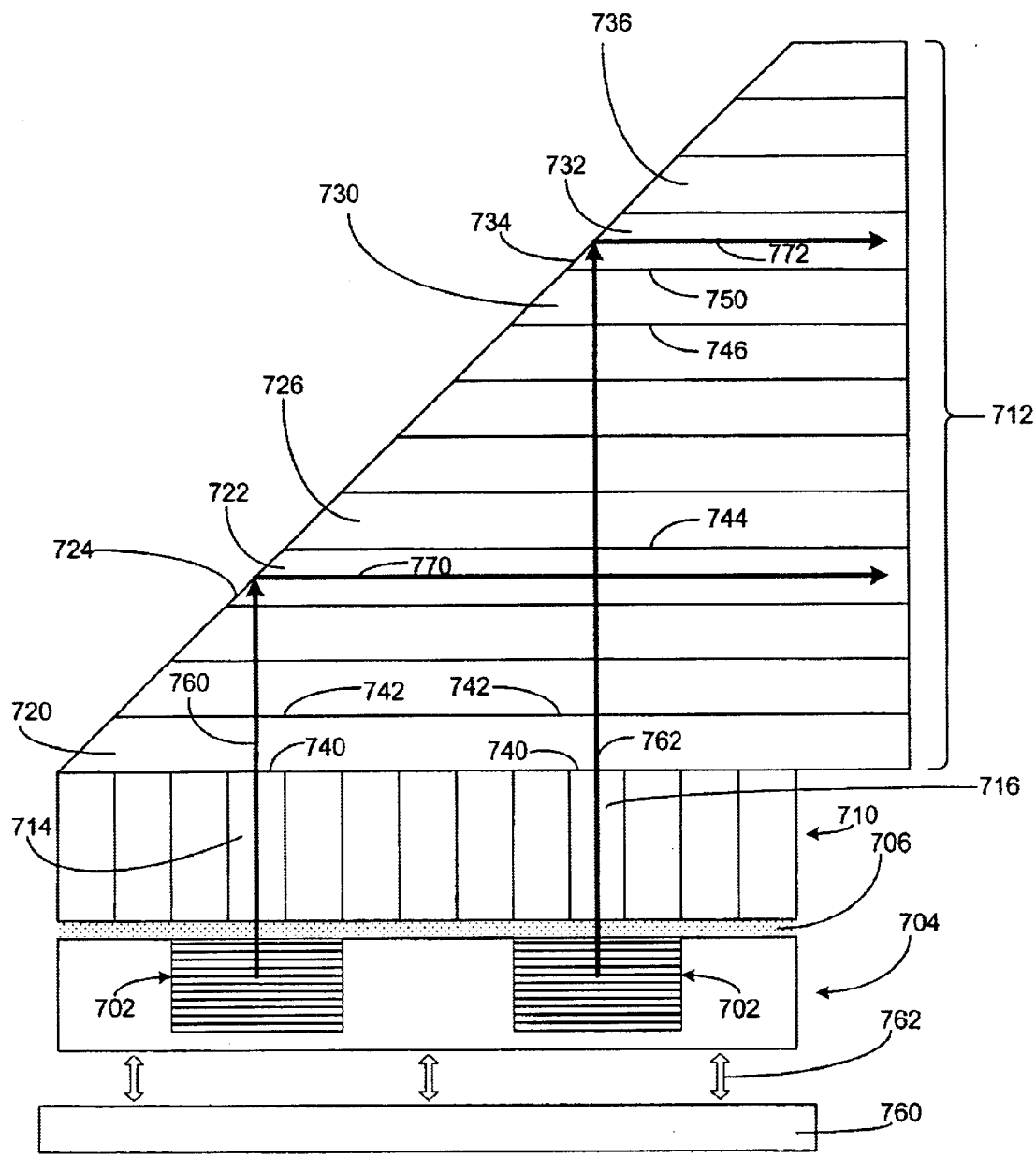
FIG. 1B is a cross-sectional view schematically illustrating an electro-optic module similar to that shown in FIG. 1A; this module, however, is optically connected to a fiber optic bundle comprising optical fibers oriented perpendicular the fibers in the fiber optic faceplate below.

The optical element 190 may comprise a rigid or flexible bundle of fibers that transports light emitted by the VSCELs 120 to a remote location. In one embodiment illustrated in FIG. 1B, the optical element 190 comprises a second faceplate 712, which is optically connected to a first faceplate 710 so as to receive light 760 and 762 emanating from a horizontally disposed array of VCSELs 702. VCSELs 702 within a VCSEL assembly 704 can be incorporated with and electrically connected to an IC 760, as indicated by arrows 762, so as to provide electrical power to the VCSELs 702 and produce, for example, modulated optical signals that are trasmitted through the first and second fiber optic faceplates.

The first and second fiber optical faceplates 710, 712 comprise a plurality of optical fibers bundled together, each fiber having a core encased in a cladding of a lower refractive index material. As discussed above, the fiber faceplates may comprise glass, quartz, or other material substantially optically transmissive to light emitted by the VCSELs.

The first faceplate 710 is mounted to a first side of the VCSELs 702 by a substantially optically transmissive adhesive layer 706, which may include index matching solution. The optical fibers such as fibers 714 and 716, in the first faceplate 710 are arranged lengthwise vertically, so as to capture and transmit light 760 and 762 that emerges from the first side of the VCSELs 702.

The second faceplate 712 is disposed adjacent to the first faceplate 710 so as to form an optical interface 740 between the end of the first faceplate 710 and the side of the second faceplate 712. The second faceplate 712 is optically coupled to the first faceplate 710, preferably by an optical adhesive that is substantially optically transmissive to light having a wavelength corresponding to the peak operating wavelength of the VCSELs 702. The second faceplate 712 comprises a plurality of fibers 720, 722, 726, 730, 732, 736 that are lengthwise horizontal and therefore substantially perpendicular to the fibers 714, 716 in the first faceplate 710. The second faceplate 712 is adapted such that the light 760 from the VCSELs 702 and the first faceplate 710 can be redirected to a substantially perpendicular direction as light 770 and coupled into the lengthwise horizontal optical fibers such as fiber 722. Redirection is accomplished by a reflective surface 724 of the second fiber optic faceplate 712 that is oriented at an angle of about 45° with respect to the vertical and horizontal. The surface 724 preferably reflects light 770 from the first fiber optic faceplate 710, e.g., by total internal reflection. This surface 724 may be formed by cleaving and/or polishing a proximal end of the fiber faceplate 712 at an appropriate angle, e.g., 45°, with respect to the vertically directed light 760 incident thereon. Metalization or other reflective coatings can be applied for the purpose of creating a highly reflective surface in the presence or absence of total internal reflection.

In this exemplary configuration, the beam of light 760, emitted from one of the VCSELs 702 travels through the lengthwise vertically oriented optical fiber 714 of the first faceplate 710. Since this beam of light 760 is directed substantially perpendicular to the interface 740, the light is substantially transmitted through the interface 740 into and across a fiber 720 passing through both the cladding and the core. After traversing the fiber 720, the light 760 is incident on an interface 742, through which the light is substantially transmitted. Reflection is minimal as a result of the normal incidence of the beam 760 with respect to the lengthwise horizontally oriented fibers 720, 722. The light 760 travels across the fiber 722 until it reaches the angled surface 724 on the proximal end of the fiber optic plate 712. As discussed above, this surface 724 is oriented at a relatively steep angle of, e.g. about 45°, with respect to the horizontal or vertical and moreover, with respect to the vertically directed incident light beam. Accordingly, the light 760 is reflected at the surface 724 by total internal reflection along the direction of the horizontally disposed optical fiber 722, parallel to the horizontally disposed array of VCSELs 702. In this manner, the vertically directed beam of light emanating from the VCSEL 702 is transported through the first fiber optical faceplate and coupled into the lengthwise horizontal fiber 722 through which it propagates in a horizontal direction.

Similarly, another exemplary beam of light 762 emitted from another VCSEL 702 travels through the fiber 716 in the first faceplate 710 and is coupled into a fiber 732 parallel to but displaced from fiber 722. The light 762 after propagating through the first fiber optic faceplate 710 passes through the plurality of fibers 720, 722, 726, 730 and interfaces 742, 744, 746, 750 therebetween until it reaches the fiber 732. The light 762, after traveling partially through the fiber 732, is reflected off the angled surface 734 by total internal reflection and directed horizontally. Beam 772, corresponds to beam 762 after it is reflected from the reflective surface 734 and propagates through the fiber 732 above the first fiber optic faceplate 710 on a path parallel to the horizontally disposed array of VCSELs 702.

The reflective surface 734 may be inclined at angles greater and less than 45° and similarly, the fibers 720, 722, 726, 730, 732, 736 maybe oriented other than horizontal. Although horizontally disposed fiber 720, 722, 726, 730, 732, 736 may be preferred to carry optical signals from one chip to another chip located on the same plane, to facilitate communication between chips on different boards or on different levels of the same board, inclinations other than 45° may be desired. The requirements for specific angles may be relaxed, however, when the second fiber optic faceplate 712 is optically connected to a flexible fiber optic cable containing a plurality of flexible optical fiber optic lines.

Figure 2:
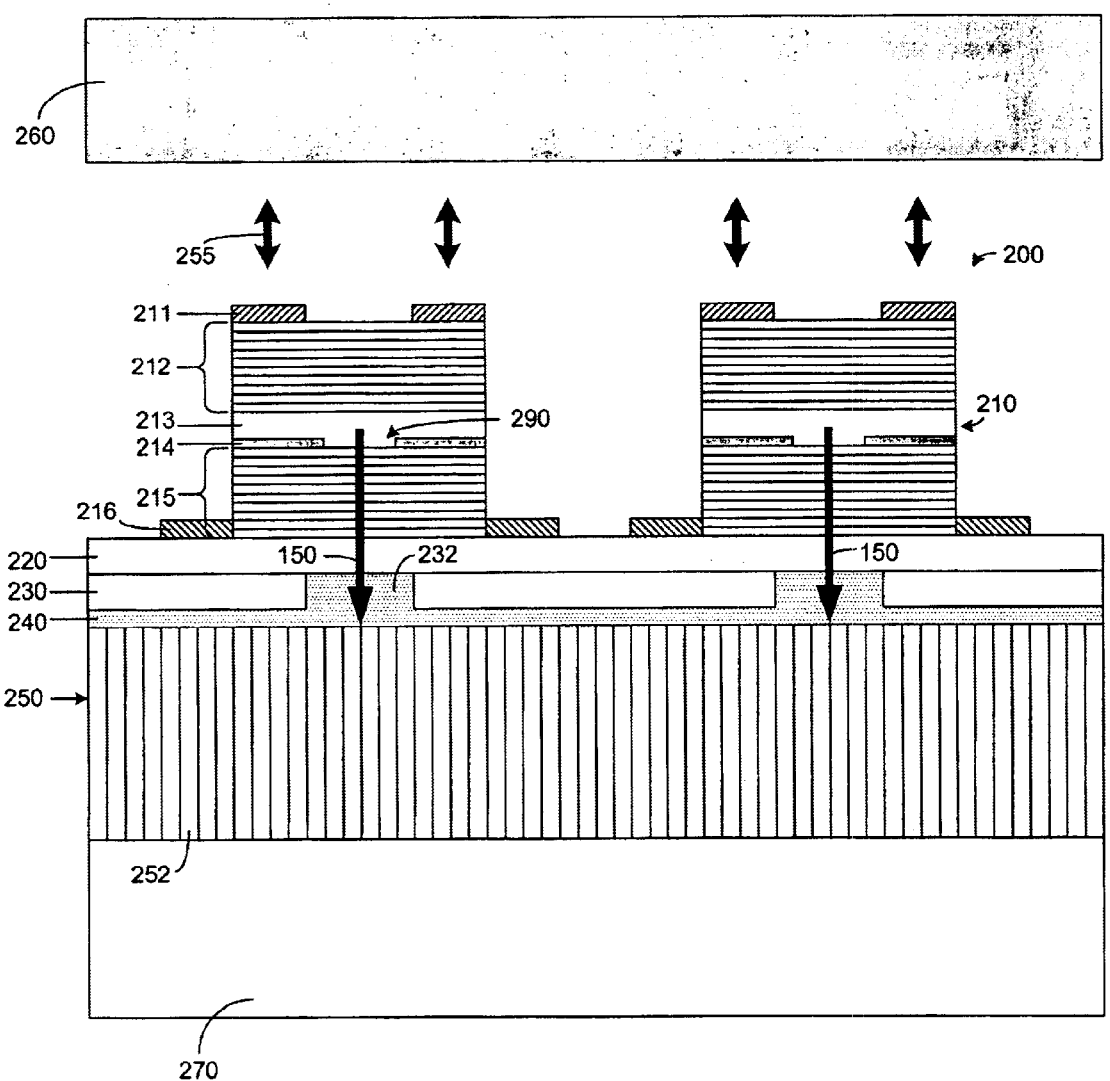
FIG. 2 is a cross-sectional view depicting an electro-optic module comprising bottom emitting VCSELs, an etch stop buffer layer, and a substrate layer mounted on a fiber optic faceplate.

In an alternative embodiment that is illustrated in FIG. 2, the VCSEL 210 is fabricated such that the light 150 is emitted through what would conventionally be considered the bottom of the VCSEL. A module 200 comprising these VCSELs 210 includes a fiber faceplate 250 into which optical output from the VCSELs is optically coupled.

The VCSEL 210 comprises a top electrode 211 and a bottom electrode 216 that permit electrical current to flow therebetween through a top distributed Bragg reflector (DBR) 212, an active region 213, and a bottom DBR 215. Electrical connections to the top and bottom electrodes 211, 216 are not shown in FIG. 2.

The VCSEL 210 further comprises an oxide layer 214 that defines an aperture 290; the current flows through the aperture 290 thereby confining and increasing the current density in a localized portion of the active region 213 contained therein. As is well-known in the art, light yield is proportional to the current density in the active region 213. Increasing current density within this portion of the active region 213 therefore provides a high intensity localized source of optical radiation.

VCSELs 210 of various output wavelength and power levels can be used and various materials and fabrication technologies may be suitable for fabricating these light sources. The oxide current confinement layer 214, for example, may be formed using a conventional method as described above. Alternatively, the oxide layer 214 may be replaced by a dielectric current concentrating element as discussed more fully below. Furthermore, although the oxide layer 214 illustrated in FIG. 2 is interposed between the active region 213 and the bottom DBR 215, its position is not so limited. In other embodiments, for example, the oxide layer 214 may be interposed between the top DBR 212 and the active region 213. Alternatively, two oxide layers may sandwich the active region 213 therebetween.

The bottom emission of the light 150 is achieved by having reflectivity of the top DBR 212 greater than that of the bottom DBR 215. Preferably, the top DBR 212 has a reflectivity of approximately 100%, and the bottom DBR has a reflectivity of less that 100%, such as for example, between about 97–99%.

Located under the bottom electrodes 216 and the bottom DBRs 215 is an etch stop buffer layer 220 that substantially protects the VCSELs 210 from the etching employed in processes for forming structures beneath the etch stop layer 220. Preferably, the etch stop layer 220 has a thickness on the order of about 0.3 μm but may range in thickness between about 0.1 μm and 2 μm, and more preferably between about 0.2 μm and 0.5 μm. Preferably, the etch stop layer 220 comprises material that is substantially optically transmissive to light emitted by the VCSELs 210. Accordingly, this etch stop layer 220 may comprise GaAs, InGaAs, InP, InGaAsP, AlGaAs, or AlGaAsSb.

Located adjacent the etch stop buffer layer 220 is the substrate layer 230 that defines apertures 232 centered beneath the VCSELs 210 so as to permit passage of the optical beam 150 therethrough. Preferably, the substrate layer 230 has a thickness in the range up to about 150 μm, and more preferably between about 100 μm and 150 μm, but may otherwise be above or below these ranges. Preferably, the substrate comprises GaAs, InGaAs, InP, InGaAsP, AlGaAs, AlGaAsSb or other semiconductor materials used for fabricating lasers that operate at the desired wavelength. Other materials that provide structural support for the module 200 may be used to form the substrate layer 230.

Preferably, the VCSELs 210 are optically coupled to the fiber faceplate 250 by an adhesive layer 240 that is substantially optically transmissive to the laser light. More preferably, the adhesive layer 240 comprises a glue that can be cured by applying heat. Examples of such adhesives includes polymer based optical epoxy and silicone. Preferably, this glue is flowable such that the adhesive layer extends into the apertures 232 defined by the substrate layer 230. More preferably, the adhesive is selected so as to provide any desired index matching, such as between, for example, the etch stop layer 220 and optical cores in the optical fiber 252 or waveguides of the faceplate 250. Index matching fluid can also be used for this purpose.

During operation, the light 150 emerging from the VCSEL 210 is transmitted through the optically transmissive etch stop buffer layer 220 and the optically transmissive glue layer 240 before entering one or more fibers 252 of the fiber faceplate 250. A fiber optic faceplate 250 similar to those discussed above may be employed. The fiber faceplate 250 is optically coupled to an element 270 adapted to transmit the light 150 in a manner well-known in the art. This optical element 270 may comprise a fiber optic faceplate similar to that shown in FIG. 1B, which directs the VCSEL output ninety degrees for ease of coupling to a flexible fiber bundle for transmission to adjacent modules. An integrated circuit IC 260, comprising for example, integrated circuitry formed on a semiconductor substrate can be bonded to the top side of the VCSELs 210 by electrical bonds as illustrated schematically by arrows 255. Additional electrical leads and/or interconnects can be used to form electrical connections between the integrated circuitry in the IC 260 and the VCSEL array. Methods well-known in the art of flip-chip solder bonding, thermo-compression bonding, or conductive adhesive can be suitably employed.

Figure 3A:
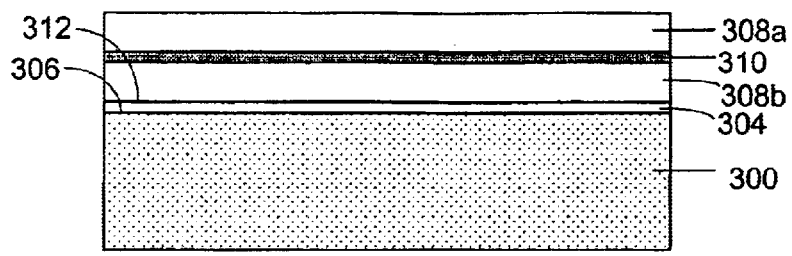
FIGS. 3A–3G are cross-sectional views schematically illustrating a preferred method of fabricating the electro-optic module of FIG. 2.
Figure 3B:
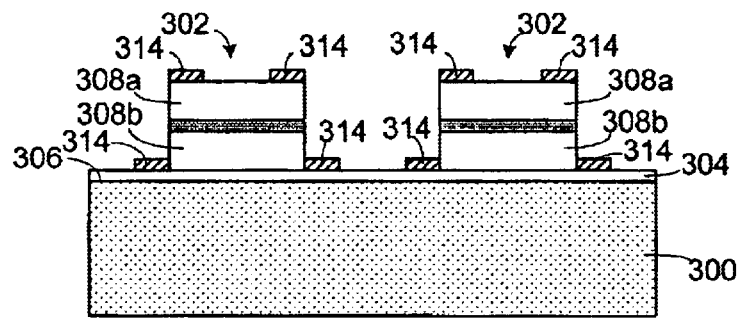

One preferred method of fabricating the above described optoelectronic module 200 is illustrated in FIGS. 3A–3G. As shown in FIGS. 3A and 3B, the preferred fabrication process begins with the formation of a plurality of VCSELs 302 on a substrate 300, which can be accomplished by conventional techniques. In one embodiment, for example, the substrate 300 is a single crystal wafer comprised of a semiconductive material such as gallium arsenide (GaAs). However, the substrate may also comprise a variety of other suitable materials for providing different laser wavelengths.

As FIG. 3A shows, the VCSELs 302 are fabricated by first forming an etch stop layer 304 on an upper surface 306 of the substrate 300. The etch stop layer 304 preferably is resistant to etchants that are subsequently used to etch the substrate 300. In one embodiment, the etch stop layer 304 is approximately 0.3 μm thick and comprises AlGaAs which can be deposited onto or grown on the substrate 300 using conventional chemical and/or physical deposition processes. Alternatively, the etch stop may comprise GaAs, InGaAs, InP, InGaAsP, or AlGaAsSb with different fractional compositions. The thickness of the etch stop layer 304 may also vary, ranging between about 0.1 μm and 2 μm. As it will be described in greater detail below, the etch stop layer 304 protects the VCSELs 302 from damage in subsequent etching processes during which portions of the substrate 300 are removed.

As FIG. 3A further shows, top and bottom distributed Bragg reflectors (DBRs) 308a, 308b with an active region 310 interposed therebetween are formed on an upper surface 312 of the etch stop layer 304. The DBRs 308a, 308b and active region 310 can be formed using generally known crystal growth processes. As it is generally understood, the top and bottom DBRs 308a, 308b serve as mirrors for the VCSELs 302 while the active region 310 provides the gain necessary for lasing. In one embodiment, each DBR 308a, 308b comprises multiple layers of AlGaAs/GaAs that are epitaxially deposited onto the substrate 300 using conventional equipment such as MBE or MOCVD. Preferably, the optical thickness of each layer is designed to provide an optical path length that is approximately one quarter wavelength of the emitted light of the laser 302. Other designs are also possible. Since the VCSELs 302 in this embodiment are intended to have bottom optical emission, the bottom DBR 308b is preferably formed to have less than 100% reflectivity, e.g., between about 97–99%, while the top DBR 308a preferably has approximately 100% reflectivity. In another embodiment, an oxide layer (not shown) is formed in the active region 310 by introducing moisture to the semiconductor layers making up the active region to oxidize the semiconductive material. As described above, the oxide layer forms an aperture that confines the current density to a portion of the active region 310.

As shown in FIG. 3B, the DBRs 308a, 308b are further processed to form individual VCSELs 302. In one embodiment, conventional photolithography and etch operations are used to isolate the VCSELs 302. Once the VCSELs 302 are isolated, conductive pads 314 may be formed on each VCSEL 302 using processes that are well-known in the art. Preferably, these conductive pads 314 serve as anodes and cathodes permitting electric current to flow from the top DBR 308a to the bottom DBR 308b of each VCSEL 302 and thus through the active region 310.

Figure 3C:
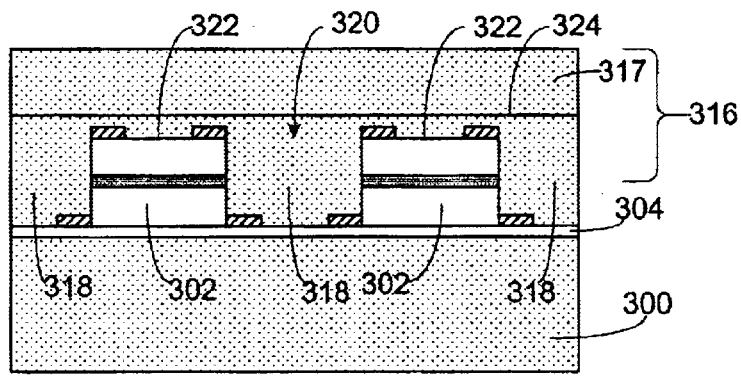

Subsequent to formation of the individual VCSELs 302, a temporary substrate 316 is affixed thereto as shown in FIG. 3C. The temporary substrate 316 stabilizes and provides structural support for the array of VCSELs 302 during subsequent processing operations. In one embodiment, the temporary substrate 316 includes a filler material 318 that is deposited in interstices 320 between adjacent VCSELs 302 prior to attaching a rigid material 317 to the filler 318. The filler material 318 may comprise wax, epoxy, a combination of both, or other suitable materials. Preferably, the filler material 318 substantially fills the interstices 320 and covers an upper surface 322 of each VCSEL 302.

As shown in FIG. 3C, the temporary substrate 316 is affixed to the VCSELs 302 by adhering the rigid material 317 to an upper surface 324 of the filler material 318 positioned adjacent the upper surface 322 of the VCSELs. Preferably, the rigid material 317 is sufficiently rigid to protect the VCSELs 302 from damage and provide additional structural support for the VCSELs during subsequent processing steps. The rigid material 317 may comprise glass or any other suitable material that is sufficiently strong and rigid to stabilize and protect the VCSELs 302 so that the substrate 300 can be processed and handled without causing damage to the VCSELs.

Figure 3D:
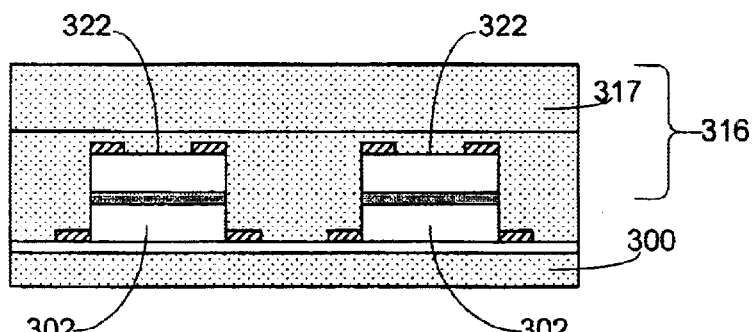

After affixing the temporary substrate 316 to the VCSELs 302, a substantial portion of the substrate 300 underneath the VCSELs 302 is removed as shown in FIG. 3D. Preferably, the substrate 300 material is removed using generally known chemical mechanical polishing (CMP) processes. Other process currently known such as ion etching, wet or dry chemical etching, or mechanical polishing, as well as process yet to be developed, may also be suitably employed to remove substrate material. During the substrate removal process, the temporary substrate 316 affixed to the VCSELs 302 stabilizes the VCSELs and protects the VCSELs from processing damage. Preferably, the removal process eliminates a substantial portion of the substrate but leaves intact a thin layer of substrate 300 to support the VCSELs. In one embodiment, the thickness of the remaining substrate 300 is as high as about 150 micrometers (μm), preferably between about 100 μm and 150 μm, but may be outside these ranges.

Figure 3E:
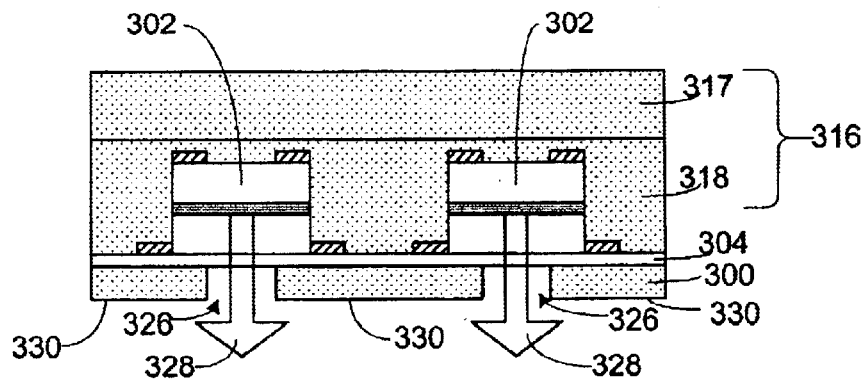
Figure 3F:
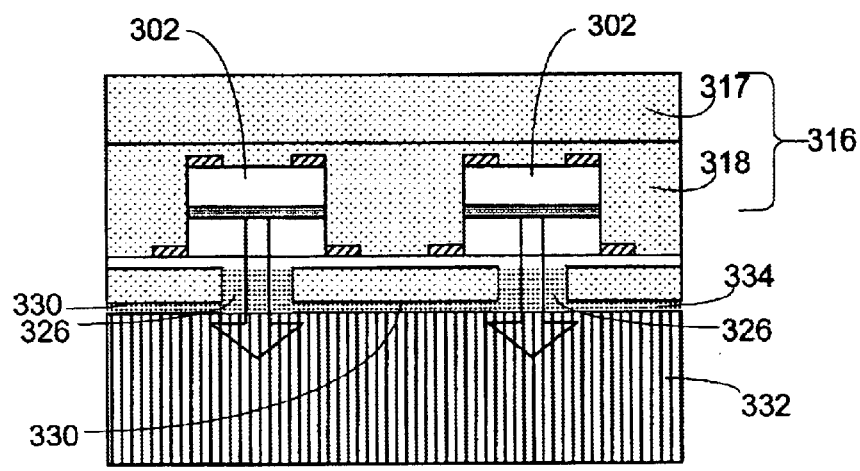

As shown in FIG. 3E, a plurality of openings 326 are subsequently formed in the remaining substrate 300 to permit transmittance of light 328 from the VCSELs 302 to other optically transmissive elements. Preferably, the openings 326 extend from an outer surface 330 of the substrate 300 to the etch stop layer 304. Each opening 326 serves as an output cavity for the individual VCSELs 302. Preferably, the openings 326 are formed in the substrate 300 using conventional photolithography and etch processes. Advantageously, the etch stop layer 304 ensures that the etchant will not contact and damage the VCSELs 302 during the etching operations. Furthermore, since the etch stop layer 304 comprises a very thin, transmissive coating, it preferably will not affect the transmission of light 328 from the VCSELs 302 through the openings 326.

After forming the openings or output cavities 326 in the substrate 300, the VCSELs 302 can be coupled to an optically transmissive element in a manner such that the optically transmissive element is positioned adjacent the output cavities of the VCSELs to receive light from the VCSELs. In the embodiment shown in FIG. 3F, the VCSELs 302 are coupled to a fiber faceplate 332. Preferably, the fiber faceplate 332 is between about 0.25–1 millimeter (mm) thick and comprises an optically transmissive fiber bundle as described above. The fiber faceplate 332 is preferably bonded to the outer surface 330 of the substrate 300 using, for example, a suitable adhesive 334. Preferably, the adhesive 334 is applied to the outer surface 330 of the substrate 300 and also fills the openings 326 in the substrate 300. In one embodiment, the adhesive 334 comprises a thermally cured adhesive so that the adhesive can be readily cured under high temperature conditions. Use of thermally cured adhesive, as opposed to UV cured adhesive, eliminates the need for directing UV light through the fiber faceplate 332 to cure the adhesive. Furthermore, the adhesive 334 is preferably substantially optically transmissive so as to not affect light transmission from the VCSELs 302 to the fiber faceplate 332. Adhesives that provide index matching may also be desirable. Index matching fluid may used for this purpose as well.

Figure 3G:
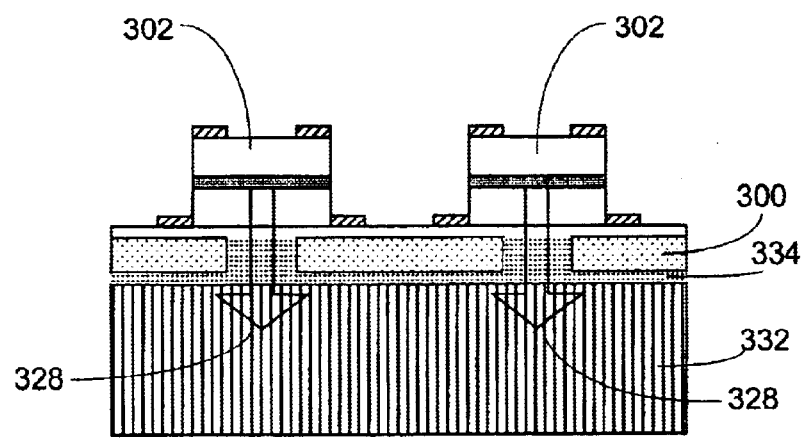

Advantageously, the fiber faceplate 332 mounted to the VCSELs 302 prevents significant divergence of the optical beam emitted from the output cavities 326 below the VCSELs. Furthermore, the fiber faceplate 332 also provides adequate structural support for the VCSELs 302 so that the temporary substrate 316 can now be removed as shown in FIG. 3G.

In one embodiment, the temporary substrate 316 is removed with chemicals such as acetone. However, other chemical and/or physical etching process may be used. If for example wax is used as the filler, heat can be applied to remove both the rigid material 317 and the filler 318 comprising the temporary substrate 316.

Following removal of the temporary substrate 316, the functional performance of the VCSEL wafer can be tested using conventional wafer probing methods. Advantageously, testing the VCSEL wafer at this stage permits identification and scrapping of defective VCSEL device 302 before additional time and labor are spent. The individual VCSELs 302 or VCSEL arrays then can be separated by cutting the wafer into a plurality of pieces, each piece containing a single VCSEL or a plurality of VCSELs. Since the VCSELs have already been tested, each functioning VCSEL 302 or VCSEL array can be directly mounted and electrically connected to a respective IC chips. Advantageously, since the VCSELs 302 are coupled to and supported by either the temporary substrate 316 or the faceplate 332, the VCSELs can be segmented prior to connection to IC chips so that only functioning VCSELs are mounted to IC chips. This approach substantially reduces the likelihood of scrapping IC chips because of defective VCSELs 302. The temporary substrate 316 and/or the faceplate 332 provide structural support to allow the wafer containing the VCSELs 302 to be cut into a plurality of devices and still maintain rigidity for testing and further processing.

Advantageously, one preferred process provides a novel fabrication method in which the VCSELs 302 are temporarily stabilized on a substrate 300 so that the substrate can be handled, manipulated, and processed without causing damage to the VCSELs. As such, the method allows the substrate to be reduced or removed and enables the formation of optical cavities 326 in the substrate 300 underneath the VCSELs 302. These designs permit light to be transmitted from the bottom DBR 308*b* to an optically transmissive element, which in turn allow for more output light emission. The preferred process also facilitates mounting of an optically transmissive element to the VCSEL array without damaging the VCSELs 302, which in turn facilitates fabrication of the optoelectronic module 200 described above.

Although in the process described with reference to FIGS. 3A–3G, apertures were formed in the substrate to permit transmission of light, such measures need not be taken to permit egress of optical output from the VCSEL array in the case where the substrate is substantially optically transmissive to the VCSEL beam. In an alternative design illustrated in FIG. 4, module 600 comprises a VCSEL 610, an etch stop buffer layer 620, and a fiber faceplate 650, similarly configured to that of FIG. 1A. The module 600 additionally comprises a substrate layer 630; however, the substrate does not have apertures formed therein as the substrate comprises material through which optical output emitted from the VCSEL is readily transmitted. For example, the substrate layer 630 may comprise materials such as GaAs, InGaAs, InP, InGaAsP AlGaAs, or AlGaAsSb that are transmissive to light 150 within selective wavelength ranges. For example, certain semiconductor materials are transmissive to long wavelength light, such as infrared light, in the wavelength range between about 980 to 1550 nanometers.

Figure 4:
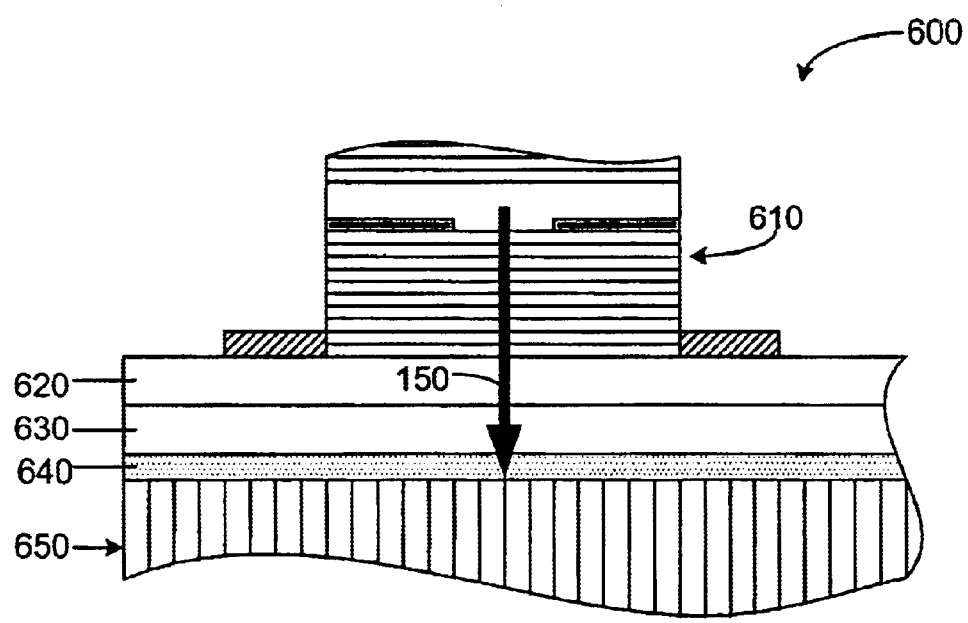
FIG. 4 is a cross-sectional view schematically depicting a portion of a bottom emitting VCSELs, an etch stop buffer layer, and a substrate layer mounted on a fiber optic faceplate, wherein the substrate layer comprises material substantially optically transmissive to light emitted by the VCSEL.

Advantageously, the module 600 shown in FIG. 4 may be fabricated by using a method that is simpler than the method described above in reference to FIGS. 3A to 3G. In particular, some of the fabrication step(s) pertaining to FIG. 3E may be omitted, since an aperture need not be etched into the substrate layer 630. This simplified method and structure of the module 600 may be appropriate in certain applications.

The methods and designs described above can be readily adapted to the optical modules comprising optical detectors in place of or in addition to VCSELs. The optical modules may, for example, comprise photovoltaic or photoconductive elements; examples of which include silicon and gallium arsenide photodiodes. These optical devices may be isolated or arranged in arrays. The optical detectors can be included on monoliths with the VCSELs or wafers comprising optical detectors without VCSELs formed thereon are considered possible. Such wafers containing optical detectors may be integrated to wafers containing VCSELs using flip chip technology described above. More preferable, however, both VCSELs and optical detectors will be integrated on the same chip. In designs employing downward directed optical detectors, i.e., where the active area faces downward beneath the optical detectors, the etch stop layer and possibly the substrate may be substantially optically transmissive to wavelengths of light to which the optical detectors are sensitive.

Figure 5:
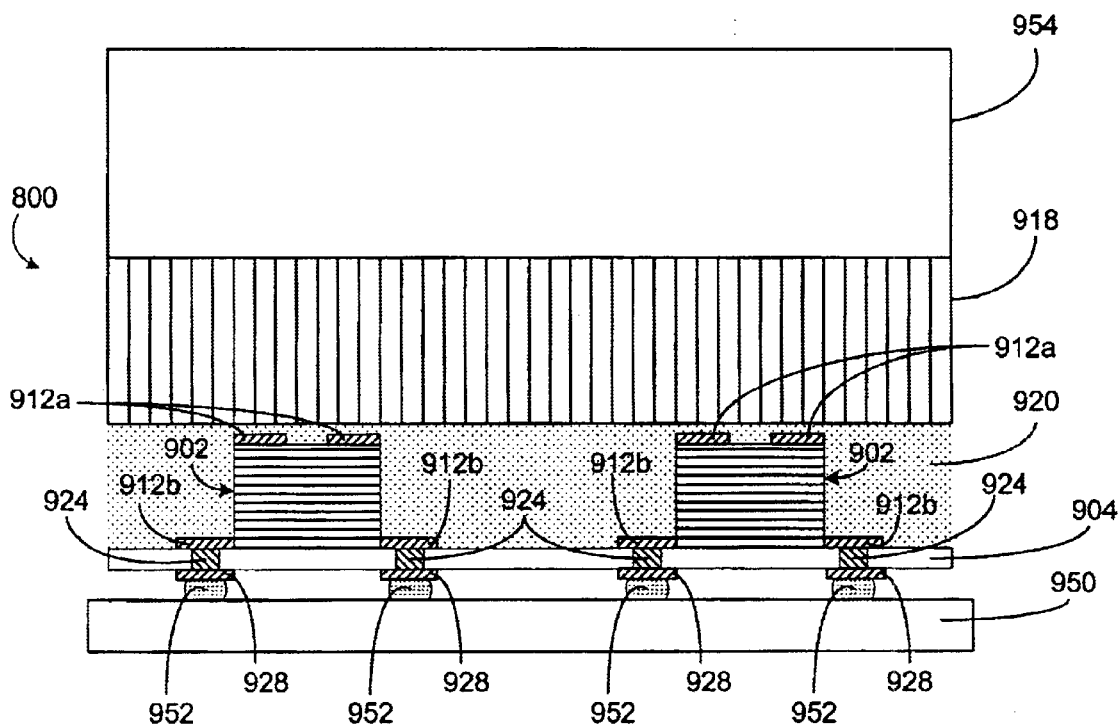
FIG. 5 is a cross-sectional view schematically illustrating an electro-optic module comprising upward emitting VCSEL optically coupled to a fiber optic faceplate comprising optical fibers vertically directed to receive light emitted by the VCSELs.

In yet another embodiment, the fiber optic faceplate can be employed on the top side of the VCSEL array (or optical detector array) to provide structural support while the bottom side is processed to provide electrical connection of the respective optoelectronic devices to integrated circuitry contained on another chip. FIG. 5 illustrates an such optoelectronic module 800 having a fiber optic faceplate formed on the top side of the VCSEL array. More particularly, the optoelectronic module 800, comprises a fiber faceplate 918 interposed between a plurality of VCSELs 902 and an optical element 954. The fiber faceplate 918 may be similar to the fiber faceplate 250 described above in reference to FIG. 2 while the optical element 954 may comprise, for example, the second fiber faceplate 712 discussed above with reference to FIG. 1B. The fiber faceplate 918 is coupled to the first side (top) of the VCSELs 902 preferably with an optically transmissive adhesive that is flowable so as to permit the glue to flow into such regions as between the VCSELs 902. The VCSEL 902 may be similar to the VCSEL 210 described above with reference to FIG. 2 comprising a top electrode 912*a* situated at the top of the VCSEL 902, and a bottom electrode 912*b* situated at the bottom of the VCSEL 902. The top and bottom electrodes 912*a*, 912*b* provide electrical current through the VCSEL 902 to cause emission of light. Adjacent the bottom of the VCSELs 902 is an etch stop buffer layer 904 that protects the VCSELs 902 during fabrication processes that remove materials below the etch stop. The etch stop buffer layer 904 may be similar to the etch stop buffer layer 220 described above in reference to FIG. 2, but is not limited to any particular type. The etch stop buffer layer 904 comprises conductive vias 926, i.e., vias filled with conductive material such as metal, that electrically connects the second electrodes 912*b* to conductive pads 928 located on the etch stop layer 904. In a manner well-known in the art, the vias 926 can be electrically isolated from the etch stop layer 904 with dielectric passivation. In one embodiment, the conductive pads 928 are connected to an IC 950 by solder bonded ball contacts 952, such that the IC 950 can provide signals to the VCSELs 902. In FIG. 5, the electrical connections between the top electrodes 912*a* and the IC 950 are not shown as such connections and the manner in which they can be formed are well-known in the art.

One preferred embodiment of fabricating the above described optoelectronic module 800 is illustrated in FIGS. 6A–6D. As shown in FIG. 6A, the preferred fabrication process begins with the formation of a plurality of VCSELs 902 on a substrate 900 using generally known techniques. In one embodiment, for example, the substrate 900 is a single crystal wafer comprised of a semiconductive material such as gallium arsenide (GaAs). However, the substrate may also comprise a variety of other suitable materials to provide, for example, different laser wavelengths.

As FIG. 6A shows, the VCSELs 902 are fabricated by first forming an etch stop buffer layer 904 on an upper surface 906 of the substrate 900. The etch stop buffer layer 904 preferably is resistant to etchants that are subsequently used to remove the substrate 900. In one embodiment, the etch stop buffer layer 904 is approximately 0.3 µm thick and comprises AlGaAs, which can be deposited or grown onto the substrate 900 using conventional chemical and/or physical deposition processes. Alternatively, the etch stop may comprises GaAs, InGaAs, InP, InGaAsP, or AlGaAsSb with different fractional compositions. The thickness of the etch stop buffer layer 904 may also vary, ranging between about 0.1 µm and 2 µm. As it will be described in greater detail below, the etch stop layer 904 protects the VCSELs 902 from damage in subsequent etching processes during which the substrate 900 is removed.

As FIG. 6A further shows, subsequent to forming the etch stop buffer layer 904, distributed Bragg reflectors (DBR) 908 are formed on an upper surface 910 of the etch stop layer 904. In one embodiment, the DBRs 908 comprise multiple layers of AlGaAs/GaAs that are epitaxially deposited onto the substrate 900 using conventional equipment such as MBE or MOCVD. Preferably, the optical thickness of each layer is designed to provide an optical path length that is about one quarter wavelength of the emitted light of the VCSEL 902.

As it is also shown in FIG. 6A, the DBRs 908 are further processed to form individual VCSELs 902. In one embodiment, conventional photolithography and etch operations are used to isolate the VCSELs 902. Once the VCSELs 902 are isolated, first and second conductive pads 912a, 912b are formed adjacent to each VCSEL 902 using processes that are well known in the art. Preferably, the conductive pads 912a, 912b serve as electrical contacts for the VCSELs 902, permitting electric current to flow therethrough. As shown in FIG. 6A, in one embodiment, the first conductive pads 912a are formed on an upper surface 914 of the VCSELs 902 and the second conductive pads 912b are formed on the upper surface 910 of the etch stop buffer layer 904 adjacent to a side wall 916 the VCSELs 902. Subsequent to forming the individual VCSELs 902, a fiber faceplate 918 is coupled to the VCSELs 902 as shown in FIG. 9B. Preferably, the fiber faceplate 918 is between about 0.25 mm to 1 mm thick and comprises an optically transmissive fiber bundle as described above. The fiber faceplate 918 is preferably bonded to the VCSELs 902 using a suitable adhesive 920. In one embodiment, the adhesive 920 comprises a thermally cured adhesive. Preferably, the adhesive 920 is deposited in interstices 922 between adjacent VCSELs 902 and covers the upper surface 914 of each VCSEL 902. Advantageously, the fiber faceplate 918 mounted to the VCSELs 902 prevents significant divergence of the optical beam emitted from the VCSELs 902. Furthermore, the fiber faceplate 918 also provides adequate structural support for the VCSELs 902 so that the VCSELs can be further handled and processed without being damaged.

As shown in FIG. 6C, after the fiber faceplate 918 is mounted to the upper surface 914 of the VCSELs 902, the substrate 900 underneath the VCSELs 902 is then removed. Preferably, the substrate 900 is completely removed, leaving the etch stop buffer layer 904 exposed. In one embodiment, the substrate 900 is removed using generally known Chemical Mechanical Polishing (CMP) processes. Advantageously, the fiber faceplate 918 affixed to the VCSELs stabilizes and structurally supports the VCSELs 902 so as to permit the removal of the entire substrate 900 without damaging the VCSELs 902.

As FIG. 6D illustrates, subsequent to removing the substrate 900, conductive vias 924 are formed in the etch stop buffer layer 904 to provide external interconnection for the VCSELs 902. In one embodiment, the vias 924 are formed using conventional photolithography, etch, and metal deposition processes. Other methods as are well known in the art or yet to be devised can be employed as well. Preferably, each via 924 extends from the second conductive pad 912b through the etch stop buffer layer 904 to an outer surface 926 of the etch stop buffer layer 904. In one embodiment, the vias 924 interconnect the conductive pads 912b adjacent the VCSELs 902 with exterior conductive pads 928 that are subsequently formed on the outer surface 926 of the etch stop layer 904. As shown in FIG. 6D, the exterior conductive pads 928 are preferably formed on the outer surface 926 of the etch stop layer 904 and positioned in alignment with a respective second conductive pad 912b that is formed on the upper surface 910 of the etch stop 904. The exterior conductive pads 928 can in turn be electrically interconnected with external sources and/or devices. In one embodiment, the exterior conductive pads 928 are solder bonded to an IC chip in a manner as shown and described with reference to FIG. 5. An integrated circuit IC 950, comprising for example, integrated circuitry formed on a semiconductor substrate can be bonded to the bottom side of the VCSELs 902 by electrical bonds 928. Additional electrical leads and/or interconnects can be used to form electrical connections between the integrated circuitry in the IC 950 and the VCSEL array. Methods well-known in the art of flip-chip bonding, thermo-compression bonding, or conductive adhesive can be suitably employed. Similarly, one or more optical components such as an optical fiber bundle and/or the fiber optic faceplate similar to that of FIG. 1B can be butted up against the fiber optic faceplate 918 to conveniently coupled light thereto. In this manner, the module 800 can be used to receive and transform electrical signals from integrated circuitry in the IC 950 into optical signals that are transmitted for example over an optical fiber bundle to a remote site.

Figure 7:
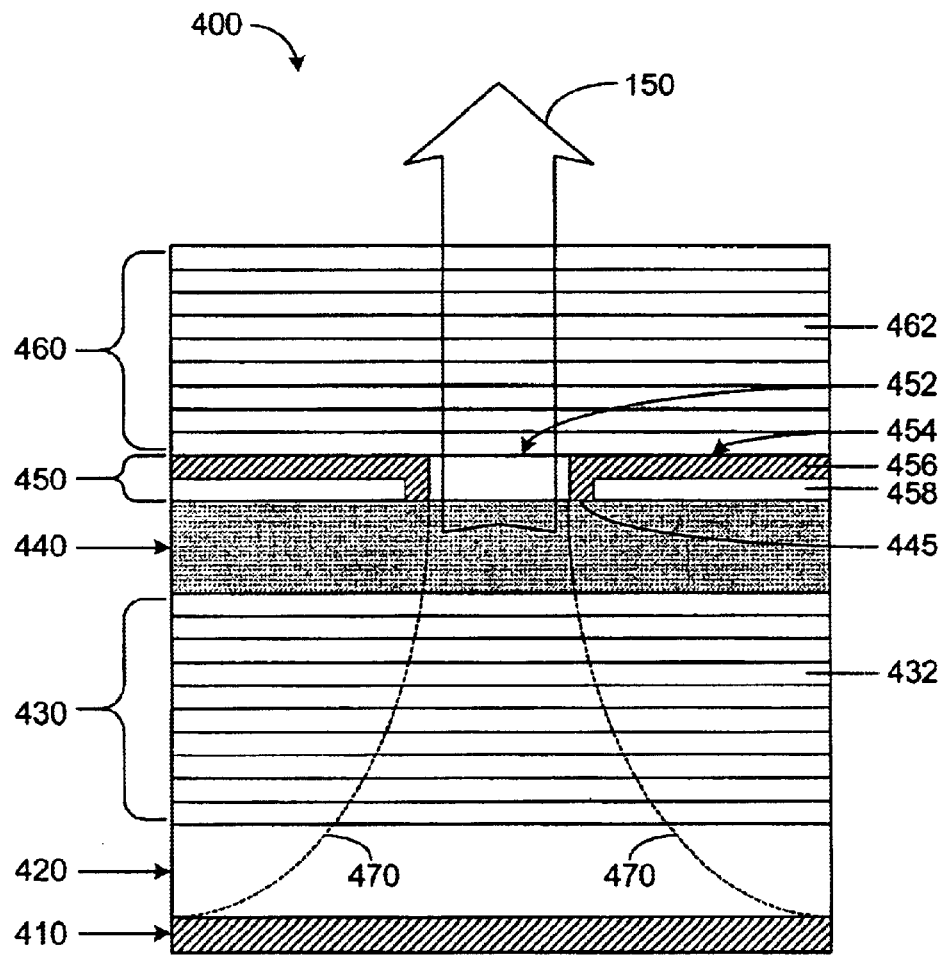
FIG. 7 is a cross-sectional view showing a VCSEL that includes a current concentrating element comprising dielectric material.

Although a variety of types of VCSELs 902 can be employed in the optoelectronic modules described above, preferably, a VCSEL 400 comprising a current concentrating element 450 as shown in FIG. 7 is employed. This VCSEL 400 comprises a bottom electrode 410, a VCSEL substrate 420, a bottom DBR 430, an active region 440, as well as a top reflector 460.

As shown in FIG. 7, the current concentrating element 450 is interposed between the active region 440 and the top reflector 460, however, this current concentrating element could in the alternative be situated anywhere above the bottom DBR 430. The current concentrating element 450 comprises an inner region 452 and an outer region 454. The inner region 452 is preferably a circular area, as viewed from the top DBR 460 and is surrounded by the outer region 454. The outer region 454 comprises a dielectric layer 458 with an inner side and an outer side, and an electrode 456 that covers the top and the inner side of the dielectric region 458.

The dielectric layer 458 may comprise an oxide that is grown a layer of semiconductor immediate beneath it. This oxide may be a compound formed from at least one of the elements in the semiconductor layer directly below. For example, if the layer beneath comprises AlGaAs, the oxide layer may comprise aluminum oxide ($AlO_2$). Alternatively, the dielectric layer 458 may comprise oxides or other dielectric materials that is formed by any of a variety of well-known or yet to be devised deposition techniques such as for example sputtering and/or evaporation. This layer may be crystalline, non-crystalline, or polycrystalline but preferably this layer does not comprise an epitaxial layer. Also, complicated process such as multiple beam epitaxy and/or MOCVD are preferably not employed so as to simplify the fabrication process and lower production times and costs. Some examples of potential dielectric materials that may be used to form the dielectric layer include silicon dioxide, $SiO_2$, as well as other oxides of silicon, e.g., SiO and $SiO_3$, silicon nitride, e.g., $Si_3N_4$, aluminum oxide, e.g. $Al_2O_3$, titanium oxide and titanium dioxide, zirconum dioxide, cryolite, and quartz. Fluorides such as aluminum fluoride, lead fluoride, and magnesium fluoride as well as metal oxides such as iron oxide, manganese oxide, cobalt oxide, copper oxide, and zinc oxide may be included in the dielectric layer. Oxides and/or fluorides of rare earth elements such as lanthanum, praseodymium, yttrium, hafnium, thorium, barium, and cerium are also considered possible. The electrode 456 comprises conductive material such as metal or conductive coating. Examples of suitable metals include Al, Au, Cu, or any alloy materials that are conductive. An example of another conductive coating includes indium tin oxide (ITO). The electrode 456 preferably forms an Ohmic contact with the active region 440 at a point 445. With the application of electrical current between the electrode 456 above the active region 440 and the electrode 410 below, current flows therebetween. An exemplary current profile 470 as established between the electrode 456 and the lower electrode 410 through the active region 440 is depicted in FIG. 7.

The inner region 452 comprises an optically transmissive material that may or may not be conductive. In one embodiment, the inner region 452 is a dielectric material. In another embodiment, the inner region 452 is a conductive material such as an optically transmissive conductor like ITO. In the case where the inner region 452 is conductive, the effective electrode comprises the electrode 456 described above and the inner region 452. The inner region 452 may comprises a micro-optic element such as a beam deflector or a beam lens especially in the case wherein the inner region comprises a dielectric. This micro-optic element can provide beam shaping for light produced within the active region 440 or can be used to direct it in a particular direction. The micro-optical element may for example comprise a miniature refractive lens or possibly a diffractive optical element such as a Fresnel lens or a holographic optical element. In one embodiment, standard photolithography process can be used to fabricate binary micro-optic elements.

The top reflector 460 comprises a plurality of dielectric layers 462. In accordance with DBR design, each dielectric layer 462 preferably has a thickness substantially equal that which provides an optical path length of a quarter of a wavelength for the light emitted by the VCSEL 400. In the embodiment depicted in FIG. 7, where the light 150 is emitted at the top of the VCSEL 400, the reflectivity of the top reflector 460 is preferably slightly less than 100%.

The top reflector 460 preferably comprises a material different than that of the bottom reflector 430. The bottom DBR may, for example, comprise multiple layers of epitaxial grown semiconductor such as alternating layer of AlGaAs/GaAs, InGaAsP/InGaAs, or InP/InGaAs; however the top 460 preferably does not comprise semiconductor material and more particularly epitaxial grown semiconductor. Instead, the top 460 preferably comprises dielectric or non-conductive material such as silicon dioxide, $SiO_2$, as well as other oxides of silicon, e.g., SiO and $SiO_3$, silicon nitride, e.g., $Si_3N_4$, aluminum oxide, e.g. $Al_2O_3$, titanium oxide and titanium dioxide, zirconum dioxide, cryolite, and quartz. Fluorides such as aluminum fluoride, lead fluoride, and magnesium fluoride as well as metal oxides such as iron oxide, manganese oxide, cobalt oxide, copper oxide, and zinc oxide may be included in the dielectric layer. Oxides and/or fluorides of rare earth elements such as lanthanum, praseodymium, yttrium, hafnium, thorium, barium, and cerium are also considered possible. One or more of the dielectric layers 462 in the upper DBR 460 may comprise oxides or other dielectric materials that are formed by any of a variety of well known or yet to be devised deposition techniques such as for example sputtering and/or evaporation. These layers may be crystalline but preferably are non-crystalline, or polycrystalline. Moreover, these layers are preferably non-epitaxially grown layers; the crystalline structure is preferably not maintained from layer to layer or at least from the bottom DBR 430 to through the top DBR 460. Preferably, the epitaxy is not preserved through the current confinement layer 458, i.e., from the layer beneath the dielectric layer 458 to the layer above the dielectric layer 458. Also, complicated processes such as multiple beam epitaxy and/or MOCVD are preferably not employed to form the dielectric material that makes up the DBR layers 462 so as to simplify the fabrication process and lower production times and costs.

Figure 8A:
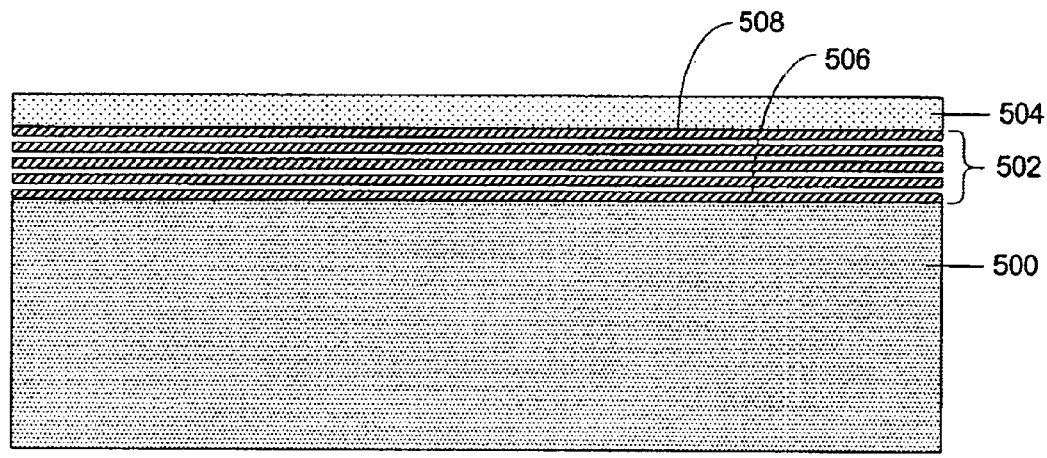
FIGS. 8A–8D are cross-sectional views schematically illustrating a preferred method of fabricating the VCSEL structure of FIG. 7.

One preferred method of fabricating the above described VCSEL structure is illustrated in FIGS. 8A–8D. As shown in FIG. 8A, the fabrication process begins with the formation of a bottom DBR 502 on a substrate 500. In one embodiment, the substrate 500 is a single crystal wafer comprised of a semiconductive material such as gallium arenside (GaAs). However, the substrate 500 may also comprise a variety of other suitable materials and in particular other semiconductor materials such as, e.g., InGaAs, InP, InGaAsP, AlGaAs, or AlGaAsSb.

The bottom DBR 502 is formed on an upper surface 506 of the substrate 500 while an active region 504 is formed on an upper surface 508 of the bottom DBR 502. Both the bottom DBR 502 and the active region 504 can be formed using conventional crystal growth processes. The crystal epitaxy is preferably maintained from the substrate on through the active region. In one embodiment, the bottom DBR 502 comprises multiple layers of AlGaAs/GaAs that are epitaxially deposited onto the GaAs substrate 500 using conventional equipment such as MBE or MOCVD.

Figure 8B:
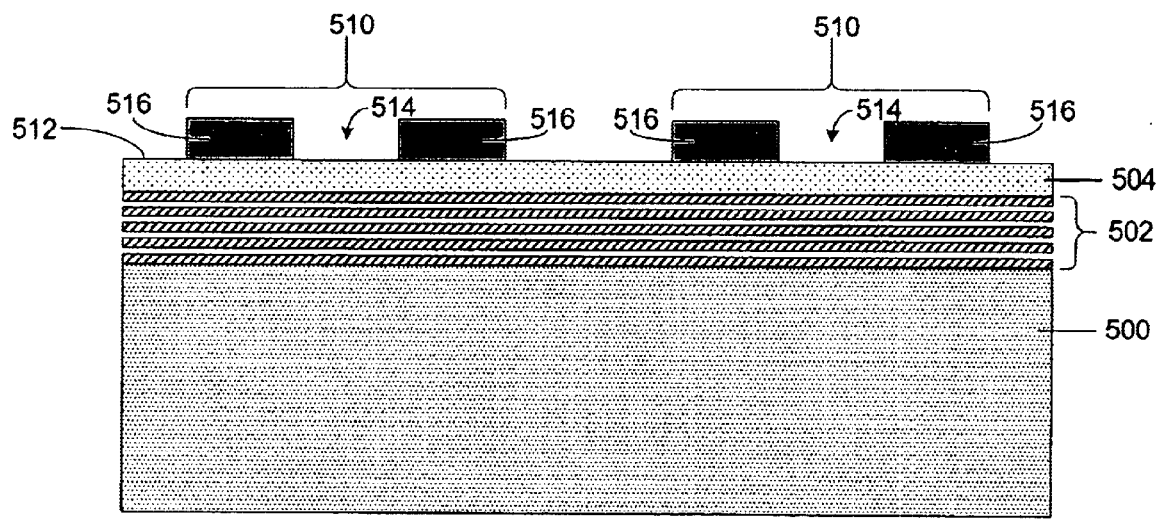

As FIG. 8B shows, a current confinement element 510 is subsequently formed on an upper surface 512 of the active region 504. In one embodiment, the current confinement element 510 is formed by first depositing dielectric material on the upper surface 512 of the active region 504. Preferably, the dielectric layer 516 comprises an oxide that can be deposited using standard dielectric deposition processes. As described above, this dielectric layer 516 for use in current confinement, can be formed by oxidizing semiconductor material above or below the active region 504. In the case where the active region 504 includes a top layer comprising AlGaAs, for example, exposure to oxygen in high temperature and high humidity environment, will create an aluminum oxide ($AlO_2$) layer. Oxidation, however, is not the only technique for producing the dielectric layer 516. Other dielectrics may be deposited, for example, by sputtering or evaporation. Dielectric material from a sputter target or a Knudsen cell is vaporized and transported to the surface of the wafer to form a layer of the dielectric thereon. Chemical vapor deposition and spin coating are other deposition techniques that may be employed. Layers of silicon dioxide, $SiO_2$, as well as other oxides of silicon, e.g., SiO and $SiO_3$, silicon nitride, $Si_3N_4$, aluminum oxide, e.g. $Al_2O_3$, titanium oxide and titanium dioxide, zirconum dioxide, cryolite, and quartz can be deposited. Fluorides such as aluminum fluoride, lead fluoride, and magnesium fluoride as well as metal oxides such as iron oxide, manganese oxide, cobalt oxide, copper oxide, and zinc oxide may be included in the dielectric layer. Oxides and/or fluorides of rare earth elements such as lanthanum, praseodymium, yttrium, hafnium, thorium, barium, and cerium are also considered possible.

As FIG. 8B further shows, the dielectric layer 516 is patterned to provide a plurality of apertures 514 in the dielectric layer. Standard patterning techniques may be employed as are well known, such as for example the use of photolithography, employment of photoresist, and wet or dry etching techniques. Other patterning methods including those yet developed may also be employed. In one embodiment, the apertures 514 comprise substantially circular openings that are created using generally known photolithography and etch processes. Advantageously, the photolithography and etch process allows the apertures 514 to be fabricated with extreme precision and uniformity so that the aperture size, shape, and location can be controlled to optimize performance of the VCSEL.

Figure 8C:
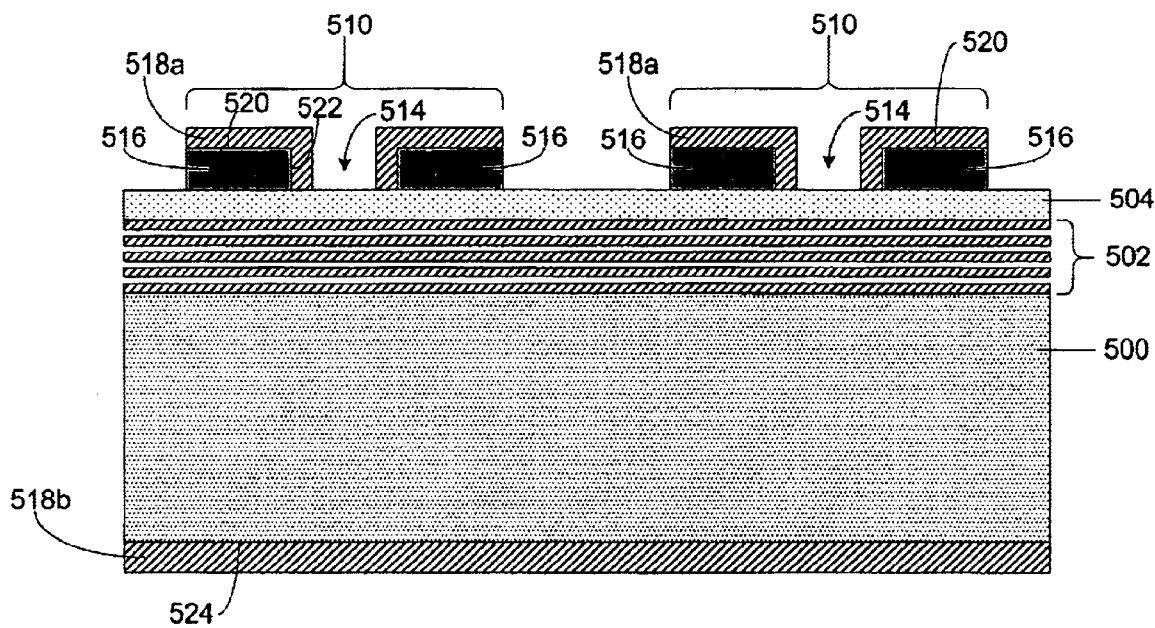

As FIG. 8C shows, after forming the current confinement element 510, conductive contacts 518a are created for external electrical connection. In one embodiment, the conductive contacts 518a comprise metal such as Al, Au, Cu, or any alloy materials that are conductive. Deposition methods such as evaporation, sputtering, CVD or other fabrication techniques are well known in the art may be employed. The conductive contacts 518a preferably extends across an upper surface 520 of the patterned dielectric layer 516, down an inner side wall 522 of the aperture 514, and contacts the active region 504. Preferably, one end of the conductive contacts 518a can be accessed externally, i.e., after the top DBR is formed thereon, while a second end extends into the aperture 514 and contacts the active region 504. As discussed above, preferably an ohmic contact is formed between this second end of the contact 518a and the active region 504. As FIG. 8C further shows, another conductive contact 518b is preferably formed on a lower surface 524 of the substrate 500. However, in one embodiment not shown, another conductive contact can be formed in the region between the first conductive contacts 518a on the top surface above the active region 524.

In one embodiment not shown, the aperture 514 may then be filled with a substantially optically transmissive material such as a dielectric. Examples of such dielectrics include but are not limited to silicon dioxide and silicon nitride. This dielectric material can be patterned to form an optical element within the aperture 514. For example, grooves can be formed in and/or on the surface of the dielectric material to create a grating, Fresnel lens, or holographic optical element to shape the beam of light produced by the VCSEL. Other types of micro-lens, such as refractive lens are also envisioned. Additional dielectric material can be deposited thereon to form the top DBR.

Figure 8D:
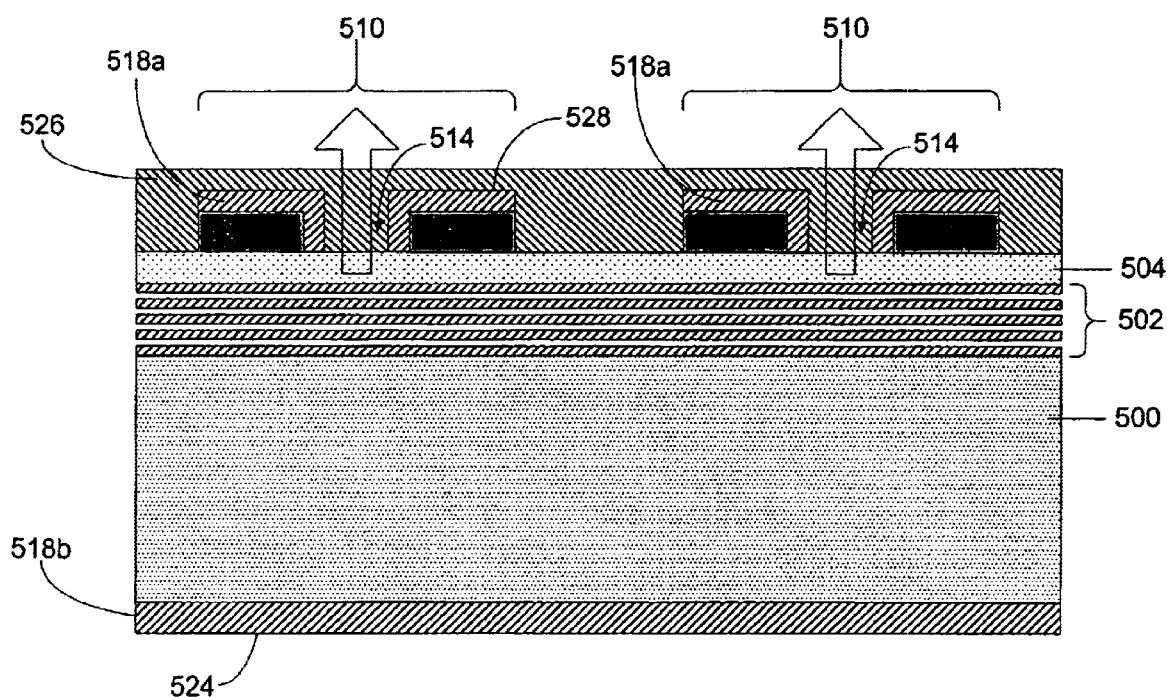

In the embodiment depicted in FIG. 8D, however, a dielectric layer 526 is preferably formed over the current confinement element 510 after the conductive contacts 518a are created. As shown, the dielectric layer 526 is preferably formed on an upper surface 528 of the conductive contact 518a and also fills the inner region 514 of the current confinement element 510. This dielectric layer 526 may be included as one of a plurality of layer that together form the top DBR (not shown) of the VCSEL. Additional dielectric layers (also not shown) that form the top DBR are layered thereon. These layers may be crystalline, non-crystalline, or polycrystalline. However, these layers are preferably not epitaxially grown and moreover, epitaxy is not maintained with that of the semiconductor layers comprising the lower DBR 502 or the active region 504. Preferably, these layers comprise material substantially optically transmissive to the wavelength of laser light generated within the active region and output by the VCSEL.

As discussed above, deposition by sputtering and evaporation as well as chemical vapor deposition (CVD) can be employed. Dielectric material can be sputtered from a sputter target or can be evaporated from a Knudsen cell resulting in accumulation of the dielectric material on the wafer. Other techniques for creating a layer of dielectric can also be employed. To form the DBR, the layers of alternating composition each having a thickness preferably to provide an optical path length of a quarter of a wavelength. Examples of dielectric materials that can be used include silicon dioxide, $SiO_2$, as well as other oxides of silicon, e.g., SiO and $SiO_3$, silicon nitride, $Si_3N_4$, aluminum oxide, e.g. $Al_2O_3$, titanium oxide and titanium dioxide, zirconium dioxide, cryolite, and quartz. Fluorides such as aluminum fluoride, lead fluoride, and magnesium fluoride as well as metal oxides such as iron oxide, manganese oxide, cobalt oxide, copper oxide, and zinc oxide may be included in the dielectric layer. Oxides and/or fluorides of rare earth elements such as lanthanum, praseodymium, yttrium, hafnium, thorium, barium, and cerium are also considered possible.

By fabricating the top DBR with dielectric material, instead of alternating layers of epitaxial grown doped semiconductor, deposition requirements may be relaxed resulting in shorter processing times, higher yields, and lower cost in contrast with conventional methods that rely on epitaxial grown material to form the top DBR. Furthermore, the VCSEL structure also has an aperture 514 above the active region 504 which is formed by patterning. Accordingly, the size shape and location of the aperture 514 are more precise and uniformly defined. Various performance requirements dependent on the features of the aperture 514 can therefore be better optimized.

Although the foregoing description of the preferred embodiments of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the invention.

What is claimed is:

1. A method of forming an optoelectronic module, comprising:

forming a plurality of Vertical Cavity Surface Emitting Lasers (VCSELs) on a substrate;

removing a portion of the substrate;

etching openings through the thickness of the substrate for light from the VCSELs to pass;

mounting a fiber optic faceplate which receives light from said etched openings at the location of the removed substrate to provide optical access to said VCSELs;

stabilizing the VCSELs prior to mounting the fiber optic faceplate by affixing a temporary substrate to the VCSELs; and removing said temporary substrate after mounting the fiber optic faceplate to the VCSELs.

2. The method of claim 1, wherein a layer of the substrate is removed so that said substrate is less than about 150 μm thick.

3. The method of claim 1, wherein said temporary substrate comprises glass.

4. A method of forming an optoelectronic module, comprising:

forming a plurality of Vertical Cavity Surface Emitting Lasers (VCSELs) on a substrate;

removing a layer of the substrate so that said substrate is less than about 150 μm thick;

mounting a substantially optically transmissive element at the location of the removed substrate to provide optical access to said VCSELs; and stabilizing the VCSELs prior to mounting the optically transmissive element by affixing a temporary substrate to the VCSELs, wherein interstices between adjacent VCSELs are filled with a filler material and a temporary substrate is adhered to said filler material.

5. The method of claim 4, further comprising removing said temporary substrate after the optically transmissive element is mounted to the VCSELs.

6. The method of claim 4, wherein said temporary substrate comprises glass.

7. The method of claim 6, wherein said filler material comprises wax and glue.

8. A method of forming an optoelectronic module, comprising:

forming a plurality of optoelectronic devices comprising Vertical Cavity Surface Emitting Lasers (VCSELs) and optical detectors on a substrate;

removing a portion of the substrate;

etching openings through the thickness of the substrate for light to pass;

mounting a fiber faceplate that directs light into said etched openings at the location of the removed substrate to provide optical access to said optoelectronic devices; and stabilizing the optoelectronic devices prior to mounting the fiber faceplate by affixing a temporary substrate to the optoelectronic devices.

9. The method of claim 8, wherein a layer of the substrate is removed so that said substrate is less than about 150 μm thick.

10. The method of claim 8, further comprising removing said temporary substrate after the fiber faceplate is mounted to the VCSELs.

11. A method of forming an optoelectronic module, comprising:

forming a plurality of optoelectronic devices comprising Vertical Cavity Surface Emitting Lasers (VCSELs) and optical detectors devices on a substrate;

removing a portion of the substrate;

etching openings through the thickness of the substrate for light to pass;

mounting a substantially optically transmissive element at the location of the removed substrate to provide optical access to said optoelectronic devices; and stabilizing the optoelectronic devices prior to mounting the optically transmissive element by affixing a temporary substrate to the optoelectronic devices, wherein interstices between adjacent optical detectors are filled with a filler material and a temporary substrate is adhered to said filler material.

12. The method of claim 11, wherein said temporary substrate comprises glass.

13. The method of claim 11, wherein said temporary substrate comprises glass.

14. The method of claim 11, wherein said filler material comprises material selected from the group consisting of wax and glue.

15. A method of forming an optoelectronic module, comprising:

forming a plurality of Vertical Cavity Surface Emitting Lasers (VCSELs) on a substrate;

removing a layer of the substrate so that said substrate is less than about 150 μm tick;

mounting a faceplate at the location of the removed substrate to provide optical access to said VCSELs;

stabilizing the VCSELs prior to mounting the faceplate by affixing a temporary substrate to the VCSELs; and mounting on said faceplate an optical element that redirects said light from said VCSELS in a substantially perpendicular direction.

16. The method of claim 15, comprising mounting a wedge-shaped fiber optic faceplate on said faceplate, said wedge-shaped fiber optic face plate comprising a plurality of optical fibers aligned lengthwise parallel to each other and a reflective surface oriented at an angle with respect to lengthwise parallel optical fibers to couple light thereto.

17. The method of claim 15, wherein said temporary substrate comprises glass.

18. The method of claim 15, further comprising removing said temporary substrate after the faceplate is mounted to the VCSELs.

* * * * *